(12) United States Patent
Ito et al.

(10) Patent No.: US 8,149,068 B2
(45) Date of Patent: Apr. 3, 2012

(54) TEMPERATURE CONTROLLED CRYSTAL OSCILLATOR

(75) Inventors: Manabu Ito, Saitama (JP); Hiroyuki Mitome, Saitama (JP); Takeo Oita, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 73 days.

(21) Appl. No.: 12/800,154

(22) Filed: May 10, 2010

(65) Prior Publication Data

US 2010/0289589 A1    Nov. 18, 2010

(30) Foreign Application Priority Data

May 18, 2009  (JP) .................................. 2009-119982
Sep. 15, 2009  (JP) .................................. 2009-212702

(51) Int. Cl.
*H03B 5/32* (2006.01)
*H03B 1/00* (2006.01)
(52) U.S. Cl. ............. 331/158; 331/66; 331/69; 331/176
(58) Field of Classification Search .................... 331/69, 331/70, 66, 176, 158, 116 R, 116 FE; 310/343
See application file for complete search history.

(56) References Cited

U.S. PATENT DOCUMENTS

| 6,208,213 | B1 * | 3/2001 | Anastasyev et al. ............ 331/69 |
| 7,345,552 | B2 * | 3/2008 | Ito et al. ........................ 331/69 |
| 2007/0057742 | A1 * | 3/2007 | Mitome et al. ................ 331/158 |

FOREIGN PATENT DOCUMENTS

| JP | 03014303 A | 1/1991 |
| JP | 8237031 A | 9/1996 |
| JP | 2005-165630 | 6/2005 |
| JP | 2005-333315 | 12/2005 |
| JP | 2007110698 A | 4/2007 |
| JP | 2008-117804 | 5/2008 |

* cited by examiner

*Primary Examiner* — Ryan Johnson
(74) *Attorney, Agent, or Firm* — Scott D. Wofsy; Edwards Wildman Palmer LLP

(57) ABSTRACT

A temperature controlled oscillator is provided with a circuit substrate having a crystal resonator, an oscillating circuit, and a temperature control circuit, arranged on one or both principal surfaces, and a container main body that accommodates the circuit substrate and has mount terminals on an outer bottom surface thereof. The temperature control circuit includes at least a first temperature sensor that detects an operating temperature of the crystal resonator, a second temperature sensor that detects a surrounding temperature of the container main body, and a heating resistor that applies heat to the crystal resonator, and lead wires extend from the circuit substrate and are connected electrically to the mount terminals. An insulation groove that passes through the circuit substrate in a thickness direction is formed between: a first lead wire closest to the second temperature sensor, and the second temperature sensor; and the heating resistor.

10 Claims, 11 Drawing Sheets

TEMPERATURE CONTROLLED CRYSTAL OSCILLATOR

BACKGROUND OF THE INVENTION

1. Technical Field

The present invention relates to a temperature controlled crystal oscillator that uses a crystal resonator (hereunder, referred to as "temperature controlled oscillator"), in particular, to a temperature controlled oscillator that detects the surrounding temperature of the temperature controlled oscillator.

2. Background Art

A temperature controlled oscillator maintains the operating temperature, in particular, of a crystal resonator, at a constant temperature, and is thereby capable, without causing a frequency variation dependent on frequency-temperature characteristics, of obtaining highly stable oscillating frequencies of the order of, for example, 0.1 ppm or lower, or 1 ppb. The temperature controlled oscillator may be applied, in particular, to a fixed station of a communication facility.

3. Prior Art

FIG. 10 and FIG. 11 are diagrams for describing a conventional example of a temperature controlled oscillator disclosed in Patent Document 1 (Japanese Unexamined Patent Publication No. 2005-165630), wherein FIG. 10A is a cross-sectional view of the temperature controlled oscillator, FIG. 10B is a plan view of a circuit substrate, and FIG. 11 is a schematic circuit diagram of a temperature control circuit.

As shown in FIG. 10A and FIG. 10B, a temperature controlled oscillator 1 has a surface mount resonator 2, an oscillating circuit 3, and a temperature control circuit 4, and respective devices forming these are arranged on a circuit substrate 6 on a metallic base 5. Through the metallic base 5, there are passed lead wires 7a to 7d (the cross-sectional views thereof are omitted here in order to avoid complexity in illustration), and the circuit substrate 6 is held by the lead wires 7a to 7d. The lead wire 7a that serves as a ground is fixed in a through hole 8a of the metallic base 5 using, for example, silver braze 8, and is electrically and mechanically connected to the metallic base 5. The lead wires 7b to 7d, other than the ground 7a, that serve as a power supply terminal, an output terminal, and the like are insulated and connected with a through hole 9a of the metallic base 5 (so-called "airtight terminals"). A metallic cover 10 is joined with the upper surface of the metallic base 5 by means of resistance welding so as to seal-enclose the circuit substrate 6 therein.

The surface mount resonator 2 is configured such that an AT-cut crystal element (not shown in the diagram) is accommodated in a cross-sectionally concave-shaped surface mount resonator base composed of a laminated ceramic, and a resonator metallic cover is joined on the opening end surface of the resonator base. On the outer bottom surface of the surface mount resonator 2 (above the surface mount resonator 2 in FIG. 10A), there are provided mount terminals that electrically connect to this crystal element.

Moreover, the oscillating circuit 3 (the portion surrounded by the chain line 3 in FIG. 10B) comprises a capacitor and an oscillating amplifier arranged in an oscillating section, and it is of a Colpitts type circuit with the surface mount resonator 2 serving as an inductor component.

The temperature control circuit 4 (the portion surrounded by the chain line 4 in FIG. 10B), as shown in FIG. 11, has a thermistor 11 (the temperature characteristic thereof is negative) that detects the operating temperature of the surface mount resonator 2, a linear resistor 12 (the temperature characteristic thereof is positive) that detects the surrounding temperature of the temperature controlled oscillator 1, resistors 13A to 13C, an operational amplifier 14, a power transistor 15, and a heating resistor 16 that applies heat to the surface mount resonator 2. As shown in FIG. 10A, the thermistor 11, the power transistor 15, and the heating resistor 16, along with the surface mount resonator 2, are arranged on a principal surface of the circuit substrate 6 facing the metallic base 5, and are covered by a thermally conductive resin 17 so as to be thermally bonded thereon. As shown in FIG. 10B, the linear resistor 12 is arranged in a position distanced from the heating resistor 16 so as to facilitate detection of the surrounding temperature of the temperature controlled oscillator 1 (so as to improve responsiveness to the surrounding temperature).

As shown in FIG. 11, the linear resistor 12, the resistor 13A, and the thermistor 11 are arranged in series, with the linear resistor 12 connected to ground, and the thermistor 11 connected to a power supply voltage VCC. The power supply voltage VCC is voltage-divided by the thermistor 11, and the resistor 13A and the linear resistor 12, and the reduced voltage is taken as a control voltage. Moreover, the resistor 13B and the resistor 13C are arranged in series, with the resistor 13C connected to ground, and the resistor 13b connected to the power supply voltage VCC. The power supply voltage VCC is divided by the resistor 13B and the resistor 13C, and the reduced voltage is taken as a reference voltage.

As shown in FIG. 11, the operational amplifier 14 receives inputs of a reference voltage and a control voltage, and amplifies and then outputs the voltage difference between the reference voltage and the control voltage. The output of the operational amplifier 14 (differential voltage) is applied to the base of the power transistor 15, and the output current of the collector (collector current) is controlled by the input voltage of the base (base voltage and differential voltage). The heating resistor 16 is connected to the collector. The heating resistor 16 generates heat according to the collector current, and consequently the surface mount resonator 2 is heated while it is also heated by the heat generated by the power transistor 15. The temperature control circuit shown in FIG. 11 is an embodiment of the temperature control circuit disclosed in Patent Document 1 (Japanese Unexamined Patent Publication No. 2005-165630).

In a temperature controlled oscillator of such a conventional example, stable oscillating frequencies can be obtained even in those cases where the surrounding temperature of the temperature controlled oscillator 1 changes. The reason therefor is described below.

FIG. 12 shows the frequency-temperature characteristic of the surface mount resonator 2 having an AT-cut crystal element accommodated therein. This frequency-temperature characteristic draws a third order curve having a peak temperature in the vicinity of the temperature 85° C. on the high temperature side at or above the normal temperature 25° C. In FIG. 12, the horizontal axis represents the operating temperature of the surface mount resonator and the vertical axis represents the frequency deviation $\Delta f/f$ where f denotes vibration frequency (resonance frequency) at the normal temperature 25° C. and $\Delta f$ denotes a frequency difference with respect to the vibration frequency f at the normal temperature 25° C. As shown in FIG. 12, the vibration frequency changes with a change in the operating temperature of the crystal resonator, and accordingly, the oscillating frequency of the crystal oscillator also changes.

Consequently, the heat release temperature of the heating resistor 16 is controlled with the temperature control circuit 4 shown in FIG. 10B, to have the operating temperature of the surface mount resonator 2 at a constant temperature, thereby stabilizing the oscillating frequency. Specifically, the operating temperature of the surface mount resonator 2 is set such that the control voltage, with which the operating temperature becomes the temperature 85° C. for example, is preliminarily set to a voltage lower than the reference voltage. Thereby, the resistance value of the thermistor 11 becomes greater as the operating temperature of the surface mount resonator 2 drops, and consequently the control voltage drops. Accordingly, the differential voltage between the control voltage and the reference voltage becomes greater, the collector current flowing to the heating resistor 16 increases, and the amount of heat release of the heating resistor 16 becomes greater. On the other hand, if the operating temperature of the surface mount resonator 2 rises, the resistance value of the thermistor 11 becomes lower, the differential voltage and the collector current are consequently reduced, and the amount of heat release of the heating resistor 16 becomes lower. Therefore, the operating temperature of the surface mount resonator 2 is maintained at the temperature 85° C. and the oscillating frequency is maintained at a substantially constant frequency.

That is to say, the temperature control circuit 4 of the conventional example shown in FIG. 10A and FIG. 10B is such that, as described above, the thermistor 11 detects the operating temperature of the surface mount resonator 2, and the amount of heat released by the heating resistor 16 is controlled to thereby have the operating temperature of the surface mount resonator 2 at a constant temperature. However, even if the thermistor 11 has detected the operating temperature of the surface mount resonator 2, in the case where the surrounding temperature of the temperature controlled oscillator 1 is different, such as with normal temperature 25° C. and low temperature −30° C., the amount of heat release (heat release temperature) of the heating resistor 16 that maintains the operating temperature of the surface mount resonator 2 at 85° C. also needs to be made different depending on the surrounding temperature. For example, if the heating temperature is T1° C. when the surrounding temperature is the normal temperature 25° C., when it is −30° C., T2° C. (>T1° C.) needs to be satisfied. This is because, even when the amount of heat release of the heating resistor 16 is the same, if the surrounding temperature is different, the amount of heat absorbed by (released into) the surrounding atmosphere is different and also the amount of heat supplied to the surface mount resonator 2 is different.

Consequently, in the conventional example, as shown in FIG. 11, the linear resistor 12 that detects the surrounding temperature is connected to the resistor 13A in series. The linear resistor 12, as described above, has a positive temperature characteristic, and the resistance value increases as the temperature thereof rises. Therefore, if the surrounding temperature drops (for example, from normal temperature 25° C. to −30° C.), the operating temperature of the surface mount resonator 2 also drops. Furthermore, as described above, the resistance value of the thermistor 11 increases, and the resistance value of the linear resistor 12, which has a positive characteristic, becomes lower. Thus, in a case where the linear resistor 12 is added in addition to the thermistor 11, the control voltage increases and the differential voltage becomes greater compared to the case of only having the thermistor 11. Also, as shown in FIG. 10B, the linear resistor 12 is arranged in a position distanced from the heating resistor 16, thereby making the responsiveness to the surrounding temperature sensitive.

As a result, if the surrounding temperature of the temperature controlled oscillator 1 drops, the collector current and the amount of heat release of the heating resistor also increase, and the amount of heat release becomes dependent not only on the temperature detected by the thermistor 11 but also on the surrounding temperature of the temperature controlled oscillator. Needless to say, in contrast, even in a case where the surrounding temperature has increased, due to reverse action, the amount of heat release becomes dependent not only on the temperature detected by the thermistor 11 but also on the surrounding temperature. For this reason, even if the surrounding temperature changes within a temperature range, for example, from the normal temperature 25° C. to the temperature standard −30 to 85° C., the heating resistor 16 generates an amount of heat that maintains the operating temperature of the surface mount resonator at 85° C. and that differs according to the surrounding temperature, and consequently, the oscillating frequency at temperature 85° C. becomes more stable compared to the case of only having the thermistor 11.

SUMMARY OF THE INVENTION

Problems to be Solved by the Invention

Problems in Prior Art

However, in the temperature controlled oscillator 1 of the conventional example having the above configuration, the linear resistor 12 cannot sufficiently avoid the influence of the heat released from the heating resistor 16, and consequently cannot detect the surrounding temperature of the temperature controlled oscillator 1 at a sufficient level of precision. Therefore, there is a problem in that in a case where the surrounding temperature of the temperature controlled oscillator 1 changes, the temperature control circuit 4 cannot precisely maintain the operating temperature of the surface mount resonator 2 at a constant temperature, and consequently the oscillating frequency of the temperature controlled oscillator 1 changes.

Purpose of the Invention

An object of the present invention is to provide a temperature controlled oscillator capable of detecting the surrounding temperature of the temperature controlled oscillator at a high level of precision, and obtaining stable oscillating frequencies.

Means for Solving the Problem

Point to Note and Problem Thereof

In Patent Document 1, there is proposed a temperature controlled oscillator in which a temperature sensor (thermistor TH1 in Patent Document 1) that detects the surrounding temperature is arranged in a position that is distanced from a heating resistor and a surface mount resonator (oven 4 in Patent Document 1) and that facilitates detection of the surrounding temperature (refer to the third sentence in paragraph [0023] and FIG. 2 of Patent Document 1). The present invention focuses attention on this arrangement of the temperature sensor. However, in recent years, as the size of temperature controlled oscillators is becoming smaller (for example, planar outer size 36 mm×27 mm), there has been a problem such that a sufficient distance between a temperature sensor and a heating resistor and the like cannot be ensured, and the surrounding temperature of a temperature controlled oscillator cannot be detected at a sufficient level of precision if the temperature sensor and the heating resistor and the like are simply arranged with a distance therebetween.

Means for Solving the Problem

The present invention is a temperature controlled crystal oscillator provided with a circuit substrate having a crystal resonator, an oscillating circuit, and a temperature control circuit, arranged on one or both principal surfaces, and a container main body that accommodates the circuit substrate and has mount terminals on an outer bottom surface thereof, in which the temperature control circuit includes at least a first temperature sensor that detects an operating temperature of the crystal resonator, a second temperature sensor that detects a surrounding temperature of the container main body, and a heating resistor that applies heat to the crystal resonator according to a temperatures detected by the first temperature sensor and the second temperature sensor, and lead wires extend from the circuit substrate and are connected electrically to the mount terminals. The configuration is such that a first insulation groove that passes through the circuit substrate in a thickness direction is formed between: a first lead wire closest to the second temperature sensor, and the second temperature sensor; and the heating resistor.

Effect of the Invention

According to such a configuration, the lead wires are electrically connected to the mount terminals exposed on the outside of the temperature controlled oscillator, and it can be said that the mount terminals and the lead wires are thermally bonded by this connection because metallic materials have a high level of thermal conductivity. Therefore, the temperature of the lead wires becomes close to the surrounding temperature. Since the first insulation groove is provided between the second temperature sensor and the first lead wire, and the heating resistor, the second temperature sensor and the first lead wire are arranged effectively in a region that is thermally isolated from the heating resistor. Accordingly, the second temperature sensor can detect the temperature of the first lead wire at a high level of precision, and this means that the surrounding temperature of the temperature controlled oscillator can be detected at a high level of precision. Therefore, even in a case where the surrounding temperature of the temperature controlled oscillator changes, the operating temperature of the crystal resonator can be maintained at a constant temperature at a high level of precision by the temperature control circuit.

EMBODIMENTS

Moreover, in the present invention, there is provided a configuration such that the first lead wire that extends from the circuit substrate having the second temperature sensor arranged thereon and the first insulation groove, serves as a ground. Thereby, the second temperature sensor can detect the surrounding temperature of the temperature controlled oscillator at a further high level of precision. The reason for this is as follows.

On a set substrate that is to have a temperature controlled oscillator loaded (mounted) thereon, a ground pattern ((also referred to as "beta (which means "entirely covered" in Japanese) ground pattern")) is often provided on the entire set substrate, and this beta earth pattern has a large area and the temperature thereof becomes approximately equal to the surrounding temperature. When the temperature controlled oscillator is mounted on the mount circuit substrate, the first lead wire that serves as a ground is electrically connected to the beta ground pattern. Furthermore, in many cases, the first lead wire is often electrically connected to the outer bottom surface of a container main body that is exposed to the outside. Therefore, the first lead wire further approaches the surrounding temperature, and consequently the second temperature sensor becomes capable of detecting the surrounding temperature of the temperature controlled oscillator at a further high level of precision.

Moreover, in the present invention, the configuration is such that on one principal surface of the circuit substrate having the first insulation groove, and on which the second temperature sensor is arranged, there is formed a metallic film electrically connected to the first lead wire, and the metallic film surrounds a periphery of the second temperature sensor. Thus, the second temperature sensor is surrounded by the metallic film having a temperature equal to that of the first lead wire, and consequently the second temperature sensor is capable of detecting the surrounding temperature of the temperature controlled oscillator at a further high level of precision.

Moreover, in the present invention, the configuration is such that the second temperature sensor arranged on the circuit substrate having the first insulation groove, is electrically connected to the first lead wire. Thus, it can be said that the second temperature sensor and the first lead wire are thermally bonded. Therefore, the second temperature sensor can detect the surrounding temperature of the temperature controlled oscillator at a further high level of precision.

Moreover, in the present invention, the configuration is such that the second temperature sensor is arranged on one principal surface of the circuit substrate having the first insulation groove, and the heating resistor is arranged on an other principal surface of the circuit substrate. Accordingly, the second temperature sensor is thermally isolated from the heating resistor by the first insulation groove and the circuit substrate. Therefore, the second temperature sensor can detect the surrounding temperature of the temperature controlled oscillator at a further high level of precision.

Moreover, in the present invention, the configuration is such that: the circuit substrate is of a planarly rectangular shape; the first lead wire and second to fourth lead wires extend from four corner sections of the circuit substrate; and between the heating resistor and at least one of the second to fourth lead wires, there are formed second to fourth insulation grooves that respectively pass through the circuit substrate in a thickness direction and correspond to the second to fourth lead wires.

Thereby, an inner region of the circuit substrate surrounded by the insulation grooves is thermally isolated from the lead wires, which generally have a high level of thermal conductivity, and it is consequently possible to suppress the amount of heat of the heating resistor that escapes from the lead wires. Therefore, the inner region is totally heated by the heating resistor, and the area where the temperature is maintained constant becomes larger compared to the case where the second to fourth insulation grooves are absent. Accordingly, electronic components arranged in the inner region can sufficiently avoid characteristic variation caused by variation in temperature, and the oscillating frequency of the temperature controlled crystal oscillator can be maintained at a constant value.

Furthermore, in the present invention, the configuration is such that the first to fourth insulation grooves are of a narrow groove shape, and one end thereof is formed so as to open to an outer periphery of the circuit substrate. Thereby, the second temperature sensor and the heating resistor are thermally isolated from each other at a further high level of precision, and consequently the second temperature sensor can detect the surrounding temperature of the temperature controlled oscillator at a further high level of precision.

In the present invention, the configuration is such that the first temperature sensor is a thermistor, and the second temperature sensor is a linear resistor. Thereby, the temperature of the crystal resonator can be precisely detected, and further, the surrounding temperature of the container main body can be precisely detected while avoiding complexity in the circuit configuration.

That is to say, the temperature of the crystal resonator needs to be maintained at a constant value at a high level of precision (for example, within a range of ±0.3° C.). Therefore, a temperature sensor that is capable of detecting a minute variation in temperature is suitable for the temperature sensor of the crystal resonator. Here, a thermistor, in general, has a greater level of variation in a resistance value with respect to temperature variation (temperature coefficient), compared to that of a linear resistor and the like. Therefore, with a thermistor serving as the first temperature sensor, it is possible to precisely detect a minute variation in the temperature of the crystal resonator.

Moreover, the surrounding temperature of the container main body varies in a wide range, depending on the environment and the like where it is placed (for example, 40° C. to 70° C.). Therefore, a temperature sensor with a constant temperature coefficient across a wide range of temperature is suitable for the temperature sensor for the surrounding temperature of the container main body. The reason for this is that if the temperature coefficient becomes different depending on the temperature, then there will be a need for a circuit or the like for correcting the resistance value of the temperature sensor. Here, since a linear resistor has a temperature coefficient that is constant across a wide range of temperature, it is possible, with a linear resistor serving as the second temperature sensor, to avoid complexity in the configuration of the circuit.

BRIEF DESCRIPTION OF THE DRAWINGS

FIG. 1 includes drawings for describing a first embodiment of a temperature controlled oscillator of the present invention, wherein

FIG. 3 includes drawings for describing a third embodiment of a temperature controlled oscillator of the present invention, wherein

FIG. 7 includes drawings for describing a sixth embodiment of a temperature controlled oscillator of the present invention, wherein

FIG. 8 includes drawings for describing still another embodiment of a temperature controlled oscillator of the present invention, wherein

FIG. 10 includes drawings for describing an embodiment of a conventional technique in a temperature controlled oscillator, wherein

DESCRIPTION OF PREFERRED EMBODIMENT

First Embodiment

Figure 1A:
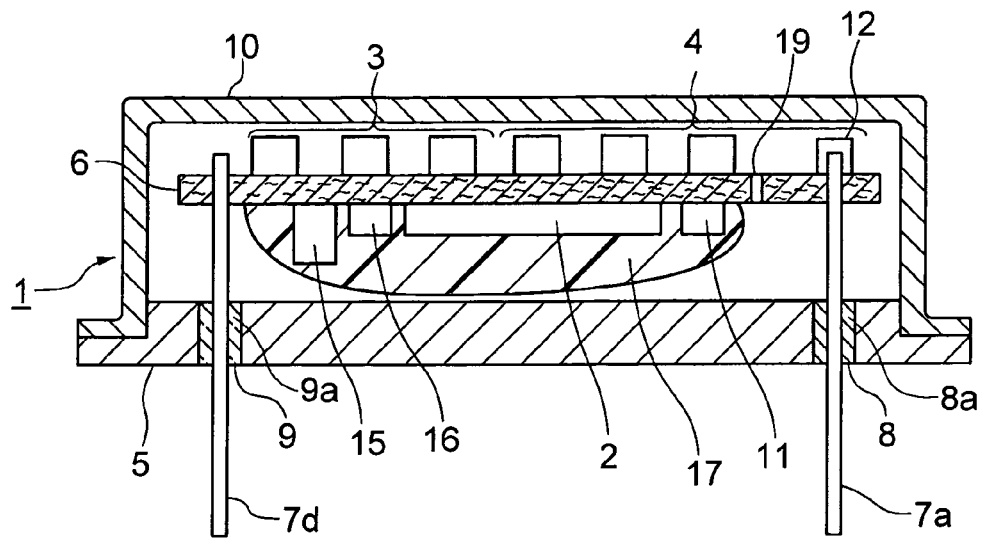
FIG. 1A is a cross-sectional view thereof.
Figure 1B:
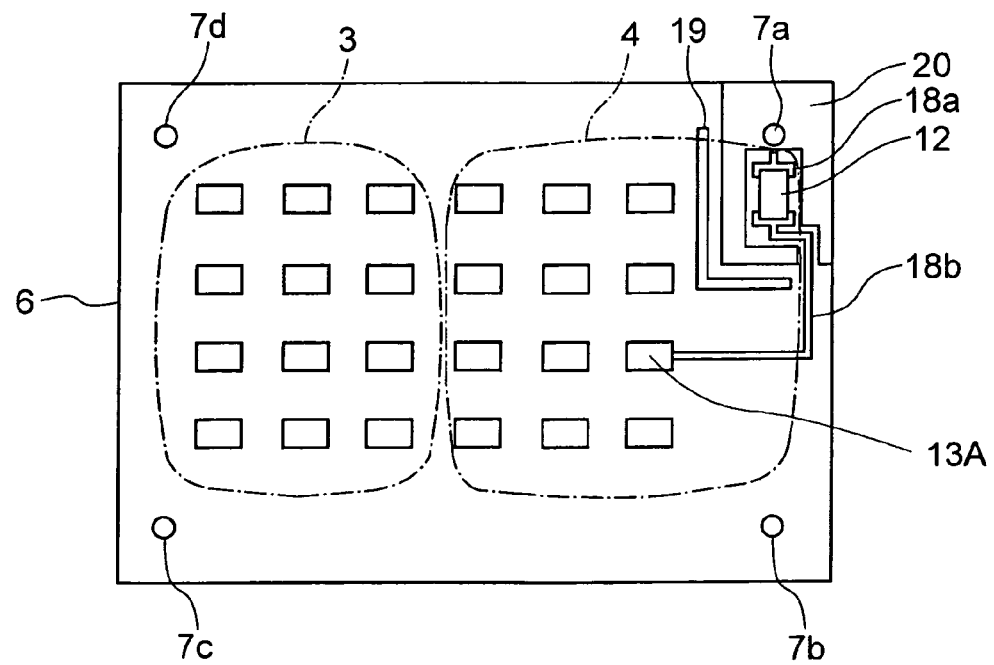
FIG. 1B is a plan view showing a top view of a circuit substrate accommodated within the temperature controlled oscillator.

FIG. 1 includes drawings for describing a first embodiment of a temperature controlled oscillator of the present invention, wherein FIG. 1A is a cross-sectional view thereof, and FIG. 1B is a plan view showing a top view of a circuit substrate accommodated within the temperature controlled oscillator. The same reference symbols are given to the portions the same as those in the conventional example, and descriptions thereof are therefore simplified or omitted.

As shown in FIG. 1A and FIG. 1B, a temperature controlled oscillator 1 of the present invention has: a surface mount resonator 2; and an oscillating circuit 3 and a temperature control circuit 4 respectively illustrated in regions surrounded by chained lines, and respective devices forming these are arranged on a circuit substrate 6 composed of a glass epoxy resin that is arranged on a metallic base 5. Through the metallic base 5, there are passed lead wires 7a to 7d (the cross-sectional views thereof are omitted here in order to avoid complexity in illustration), and the circuit substrate 6 is horizontally held by these lead wires 7a to 7d. The lead wire 7a that serves as a first lead wire and as a ground is fixed in a through hole 8a of the metallic base 5 using, for example, silver braze 8, and is electrically and mechanically connected to the metallic base 5. The lead wires 7b to 7d, other than the ground, that serve as a power supply terminal, an output terminal, and the like are insulated and connected in and with a through hole 9a of the metallic base 5. A metallic cover 10 is joined with the upper surface of the metallic base 5 by means of resistance welding so as to seal-enclose the circuit substrate 6 therein.

Figure 11:
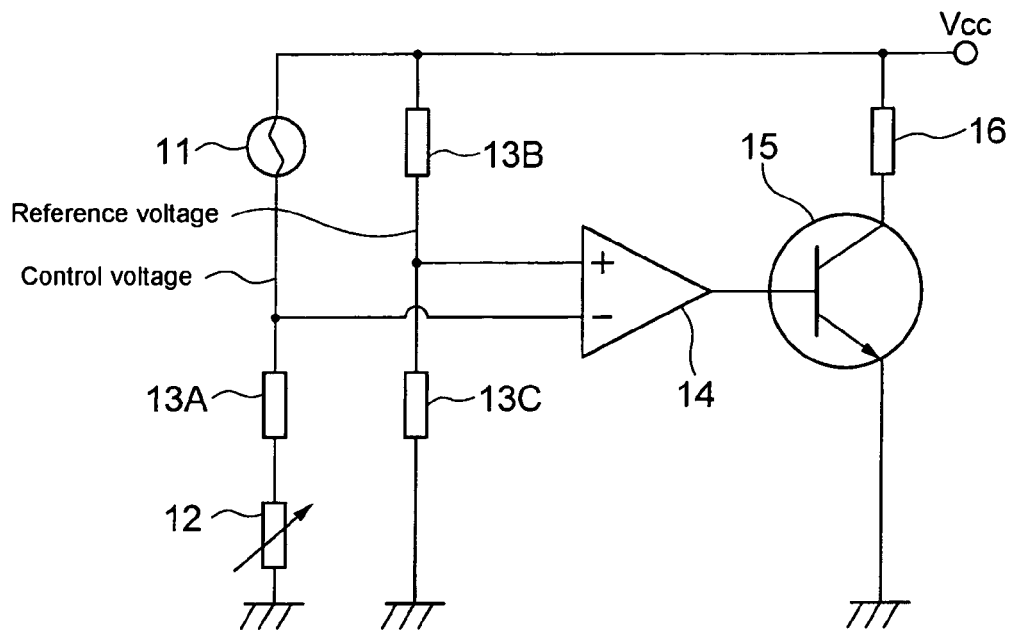
FIG. 11 is a schematic circuit diagram for describing an embodiment of a conventional technique in a temperature control circuit used in a temperature controlled oscillator.
Figure 12:
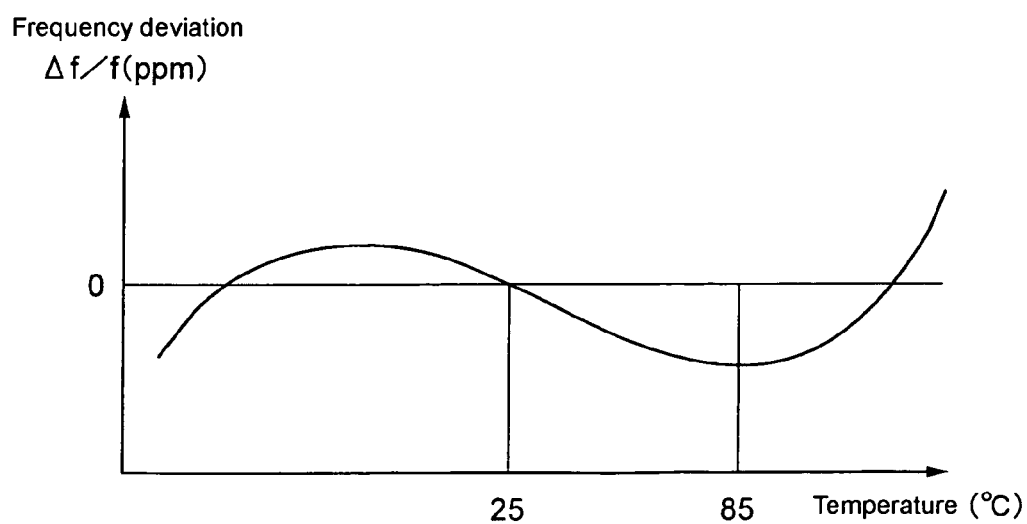
FIG. 12 is diagram showing frequency-temperature characteristic of a crystal resonator.

As with the aforementioned embodiment of the conventional technique, the foregoing temperature control circuit shown in FIG. 11 is used for the temperature control circuit 4, and a thermistor 11 that serves as a first temperature sensor is thermally bonded with the surface mount resonator 2, using a thermally conductive resin 17.

A linear resistor 12 serving as a second temperature sensor that detects the surrounding temperature of a container main body formed with the metallic cover 10 and the metallic base 5, that is, the surrounding temperature of the temperature controlled oscillator 1, is arranged on the circuit substrate 6 so as to be in close proximity to the lead wire 7a that functions as a ground. The linear resistor 12 is electrically connected to the lead wire 7a by a conducting path 18a, and further, it is electrically connected to the device of the temperature control circuit 4 by a conducting path 18b. A conducting path other than the conducting paths 18a and 18b is also formed on the circuit substrate 6, however, it is omitted in FIG. 1B. Moreover, a heating resistor 16 that heats the surface mount resonator 2, and a power transistor 5, are arranged on one principal surface of the circuit substrate 6 that faces the metallic base 5, and the linear resistor 12 is arranged on the other principal surface of the circuit substrate 6.

Moreover, between the linear resistor 12 and the lead wire 7a, and the heating resistor 16, there is provided a thin groove-shaped first insulation groove 19 that passes through the circuit substrate 6 in the thickness direction. Moreover, on the principal surface of the circuit substrate 6 having the linear resistor 12 arranged thereon, there is formed a copper film 20 (copper foil in the present embodiment) so as to surround the linear resistor 12. The copper film 20 is electrically connected to the lead wire 7a so as to serve as a ground pattern. Other than the copper film 20 in the corner section surrounded by the insulation groove 19 where the ground lead wire 7a is positioned, no ground patterns (beta ground pattern formed on the entire surface of the circuit substrate) are formed on the circuit substrate 6. That is to say, in the region other than the copper film 20, the ground pattern is not formed on the entire surface, and the foundation of the circuit substrate 6 (glass epoxy resin) is exposed.

In this case, for example, a copper foil is preliminarily formed on both of the principal surfaces of a glass epoxy resin, which is a base material of the circuit substrate 6, and then unwanted copper foil is removed by means of a commonly known photolithography technique, etching technique, and the like, to thereby form conducting paths that connect the respective elements and the copper film 20 on the circuit substrate 6. The insulation groove 19 is formed before or after the formation of the copper film 20 by means of punching.

According to such a configuration, as shown in FIG. 1B, the insulation groove 19 is formed between the linear resistor 12 and the lead wire 7a, and the heating resistor 16, and the linear resistor 12 and the heating resistor 16 are formed on the different principal surfaces of the circuit substrate 6 composed of a glass epoxy resin having low thermal conductivity. Consequently, the linear resistor 12 is thermally isolated from the heating resistor 16.

Moreover, as shown in FIG. 1A, the lead wire 7a serving as a ground is electrically connected to the metallic base 5 that is exposed to the outside. Here, since metallic materials have a high level of thermal conductivity in general, the lead wire 7a and the metallic base 5 are thermally bonded. Furthermore, in a case where the temperature controlled oscillator 1 is mounted on a set substrate with a beta ground pattern occupying a large area formed thereon, the lead wire 7a is also electrically and thermally bonded with this beta ground pattern. Therefore, the lead wire 7a has a temperature equivalent to the surrounding temperature of the temperature controlled oscillator 1, and the linear resistor 12, which is electrically and thermally bonded with the lead wire 7a, detects the surrounding temperature at a high level of precision.

Here, as shown in FIG. 1B, the copper film 20 that serves as a ground pattern connected to the lead wire 7a is provided in the corner section surrounded by the insulation groove 19. Consequently it is possible to increase the thermal capacity and further detect the surrounding temperature of the temperature controlled oscillator at a high level of precision. Since the ground pattern (copper foil) is not formed in regions other than this, even if the temperature due to the heating resistor 16 on the one principal surface of the circuit substrate 6 is transferred to the other principal surface, the influence thereof on the linear resistor 12 is small due to the low thermal capacity, and consequently it becomes possible to accurately detect the surrounding temperature.

Moreover, the temperature of the crystal resonator 2 needs to be maintained at a constant value at a high level of precision (for example, within a range of ±0.3° C.). Therefore, a temperature sensor that is capable of detecting a minute variation in temperature is suitable for the temperature sensor of the surface mount crystal resonator 2. Here, in the present embodiment, the temperature of the surface mount resonator 2 is detected with use of the thermistor 11, and temperature variation in the surface mount resonator 2 can be accurately detected because thermistors, in general, have a large temperature coefficient.

Moreover, the surrounding temperature of the temperature controlled oscillator 1 varies in a wide range, depending on the environment and the like where it is placed (for example, 40° C. to 70° C.). Therefore, a temperature sensor with a constant temperature coefficient across a wide range of temperature is suitable for the temperature sensor for the surrounding temperature of the temperature controlled oscillator 1. The reason for this is that if the temperature coefficient becomes different depending on the temperature, then there will be a need for a circuit or the like for correcting the resistance value of the temperature sensor. Here, in the present embodiment, the surrounding temperature of the temperature controlled oscillator 1 is detected with use of the linear resistor 12, and complexity and the like in the circuit configuration can be avoided because the linear resistor 12 has a constant temperature coefficient across a wide range.

Second Embodiment

Figure 2:
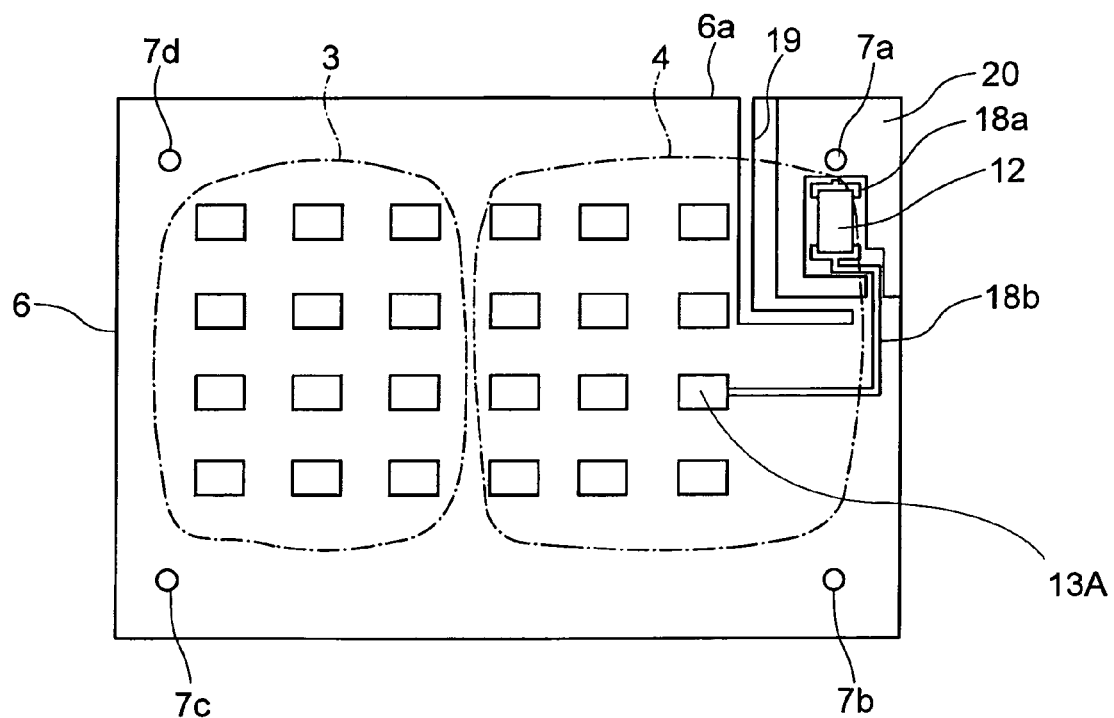
FIG. 2 is a drawing for describing a second embodiment of the temperature controlled oscillator of the present invention, and is a plan view of the circuit substrate accommodated within the temperature controlled oscillator.

FIG. 2 is a plan view for describing a circuit substrate accommodated within a temperature controlled oscillator of a second embodiment of the present invention. The same reference symbols are given to the portions the same as those in the first embodiment above, and descriptions thereof are therefore simplified or omitted.

In this second embodiment, as shown in FIG. 2, one end of a thin groove-shaped insulation groove 19 formed in the circuit substrate 6 is open to an outer periphery 6a of the circuit substrate 6. Therefore, the linear resistor 12 and the heating resistor 16 are thermally isolated from each other at a high level of precision, and the linear resistor 12 is capable of detecting the surrounding temperature of the temperature controlled oscillator 1 at a high level of precision.

Third Embodiment

Figure 3A:
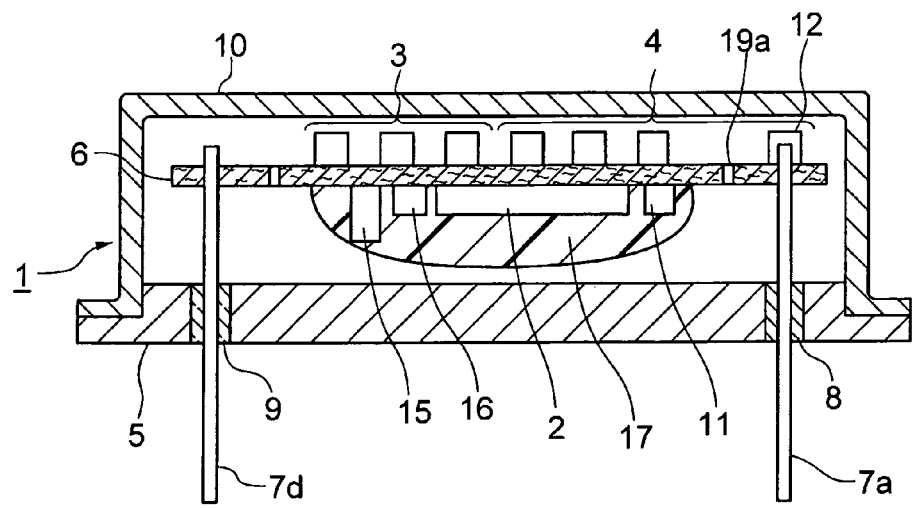
FIG. 3A is a cross-sectional view thereof.
Figure 3B:
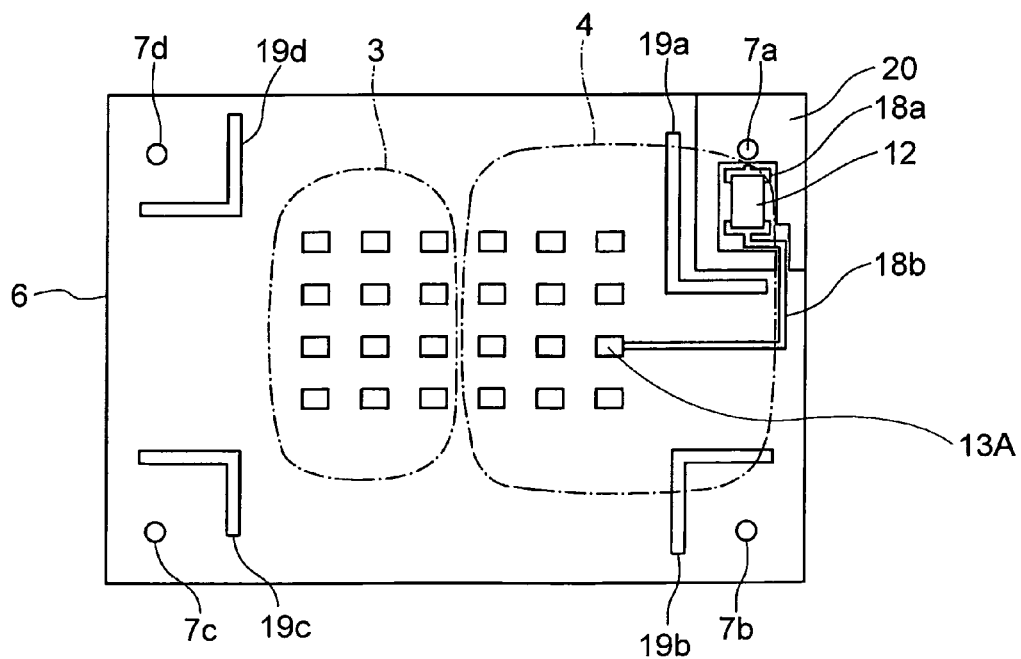
FIG. 3B is a plan view of a circuit substrate accommodated within the temperature controlled oscillator.

FIG. 3 includes drawings for describing a third embodiment of a temperature controlled oscillator of the present invention, wherein FIG. 3A is a cross-sectional view thereof, and FIG. 3B is a plan view showing a top view of a circuit substrate accommodated within the temperature controlled oscillator. The same reference symbols are given to the portions the same as those in the first embodiment above, and descriptions thereof are therefore simplified or omitted.

In the third embodiment, as with the first embodiment shown in FIG. 1, as shown in FIG. 3B, lead wires 7a to 7d extend from four corner sections of a planarly rectangular circuit substrate 6, and a first insulation groove 19a is formed between the lead wire 7a and a linear resistor 12, and a heating resistor 16. In the third embodiment, between the lead wires 7b to 7d and the heating resistor 16, there are formed second to fourth insulation grooves 19b to 19d that respectively correspond to the lead wires 7b to 7d passing through the circuit substrate 6 in the thickness direction, while other configurations are similar to those in the first embodiment above. For example, the insulation grooves 19b and 19c are formed on the circuit substrate 6. However, the insulation groove 19d may not need to be formed, that is to say, some of the insulation grooves 19b to 19d may not need to be formed on the circuit substrate 6.

According to such a configuration, as shown in FIG. 3B, the inner region of the circuit substrate 6 surrounded by the insulation grooves 19a to 19d, is thermally isolated from the lead wires 7a to 7d, which have high thermal conductivity in general, and it is consequently possible to suppress the amount of heat that escapes from the lead wires 7a to 7d. Therefore, the inner region is totally heated by the heating resistor 16 shown in FIG. 3A, and the area where the temperature is maintained constant becomes larger compared to the case where the insulation grooves 19a to 19d are absent. Therefore, it is possible to sufficiently avoid characteristic variation due to temperature variation in electronic components that constitute an oscillating circuit 3 and a temperature control circuit 4 arranged in the inner region, and oscillating frequency of the temperature controlled oscillator 1 can be maintained at a constant value.

Fourth Embodiment

Figure 4:
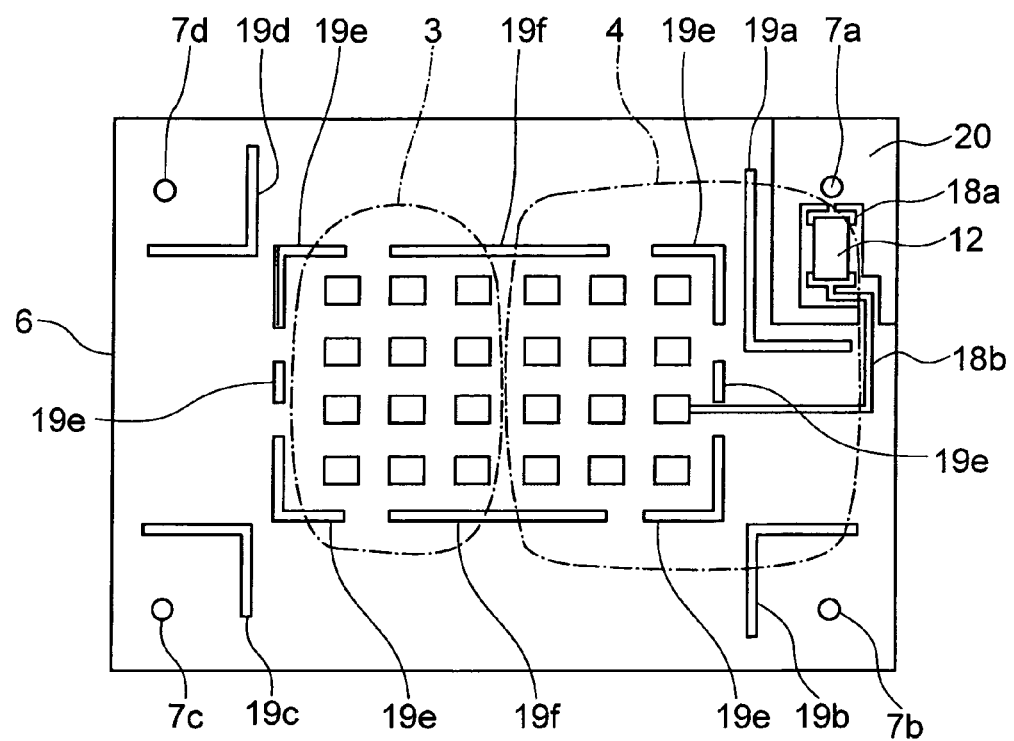
FIG. 4 is a drawing for describing a fourth embodiment of a temperature controlled oscillator of the present invention, and is a plan view of a circuit substrate accommodated within the temperature controlled oscillator.

FIG. 4 is a plan view of a circuit substrate accommodated within a temperature controlled oscillator of a fourth embodiment of the present invention. The same reference symbols are given to the portions the same as those in the third embodiment above, and descriptions thereof are therefore simplified or omitted.

In the fourth embodiment, as shown in FIG. 4, on a circuit substrate 6, there are formed insulation grooves 19e and 19f that surround an oscillating circuit 3 and a temperature control circuit 4 excluding a linear resistor 12. In a region outside the region surrounded by the insulation grooves 19e and 19f, there are arranged insulation grooves 19a to 19d and lead wires 7a to 7d. Moreover, on a surface facing the principal surface of the circuit substrate 6 shown in FIG. 4, as with the case of FIG. 1A, a surface mount resonator 2, a thermistor 11, a power transistor 15, and a heating resistor 16 are arranged in the region surrounded by the insulation grooves 19e and 19f. Other configurations are the same as those in the third embodiment above.

According to such a configuration, the region on the circuit substrate 6 having the oscillating circuit 3, the temperature control circuit 4, and the like arranged therein, and the region having the lead wires 7a to 7d, which have high thermal conductivity in general, arranged therein, are isolated from each other to a greater extent, compared to the third embodiment above. This is due to the insulation grooves 19e and 19f having been added in the fourth embodiment. Therefore, it is possible to sufficiently avoid characteristic variation due to temperature variation in electronic components that constitute the oscillating circuit 3 and the temperature control circuit 4, and oscillating frequency of the temperature controlled oscillator 1 can be maintained at a constant value at a further high level of precision. For reasons such as design problems, some of the electronic components may be arranged outside the region surrounded by the insulation grooves 19e and 19f.

Figure 5:
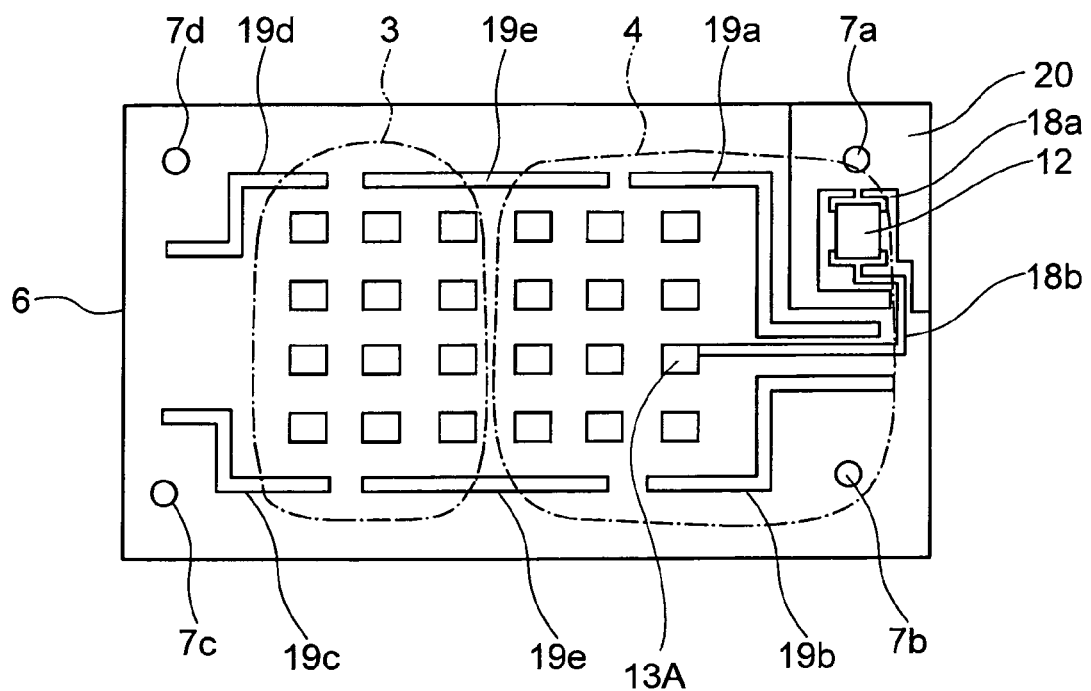
FIG. 5 is a drawing for describing a modified example of the fourth embodiment of a temperature controlled oscillator of the present invention, and is a plan view of a circuit substrate accommodated within the temperature controlled oscillator.

Moreover, as shown in FIG. 5, the insulation grooves 19a to 19d may be formed so that part of the insulation grooves 19a to 19d surround the oscillating circuit 3 and the temperature control circuit 4. Consequently, part of the role of the insulation grooves 19e and 19f shown in FIG. 4 is performed by the insulation grooves 19a to 19d. This fourth embodiment is effective in those cases where formation of the insulation grooves 19e and 19f is difficult due to miniaturization of the circuit substrate 6. Moreover, the area taken by the insulation grooves 19a to 19f is smaller compared to the third embodiment shown in FIG. 4, and it is consequently possible to sufficiently ensure the strength of the circuit substrate 6.

Fifth Embodiment

Figure 6:
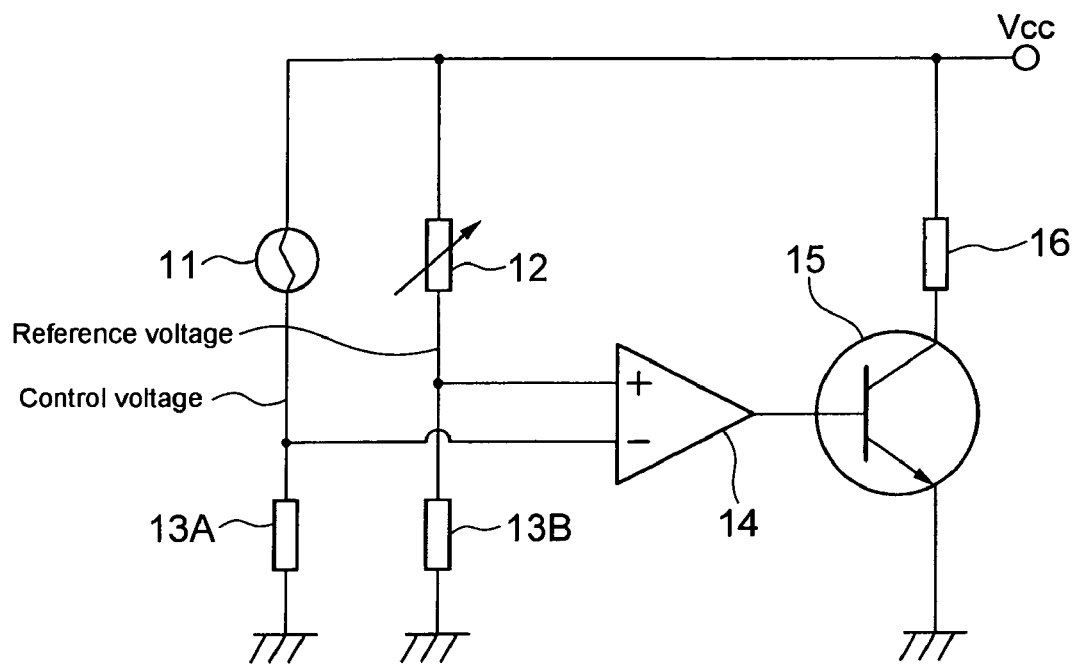
FIG. 6 is a circuit diagram of a temperature control circuit used in a fifth embodiment of a temperature controlled oscillator of the present invention.

FIG. 6 is a circuit diagram of a temperature control circuit used in a fifth embodiment of a temperature controlled oscillator of the present invention. In the fifth embodiment, other than a temperature control circuit 4, the configuration thereof is similar to that of the first embodiment above.

The temperature control circuit 4 of the fifth embodiment is described below.

As shown in FIG. 6, in the fifth embodiment, a resistor 13A and a thermistor 11 are arranged in series, with the resistor 13A connected to the ground, and the thermistor 11 connected to a power supply voltage VCC. The voltage reduced from power supply voltage VCC by the resistor 13A and the thermistor 11 is taken as a control voltage. Moreover, a resistor 13B and a linear resistor 12 are arranged in series, with the resistor 13B connected to the ground, and the linear resistor 12 connected to the power supply voltage VCC. The voltage reduced by the resistor 13B and the linear resistor 12 is taken as a reference voltage. As with the conventional example (refer to FIG. 11), the control voltage and the reference voltage are input to an operational amplifier 14, an output of the operational amplifier (differential voltage) is applied to the base of a power transistor 15, and a heating resistor 16 is connected to the collector of the power transistor 15.

Also in such a configuration, the heating resistor 16 releases heat so that the temperature of the surface mount resonator 2 shown in FIG. 1A becomes constant. That is to say, for example, if the temperature of the surface mount resonator 2 rises, then the resistance value of the thermistor 11 will drop, the control voltage will rise, and the output of the operational amplifier will drop. Accordingly, the collector current of the power transistor 15 decreases, and consequently the heat release of the heating resistor 16 is suppressed. Moreover, for example, if the surrounding temperature of the temperature controlled oscillator 1 drops, then the resistance value of the linear resistor 12 will drop, the reference voltage will rise, and the output of the operational amplifier will rise. Accordingly, the collector current of the power transistor 15 increases, and consequently the level of heat release of the heating resistor 16 becomes higher.

Sixth Embodiment

Figure 7A:
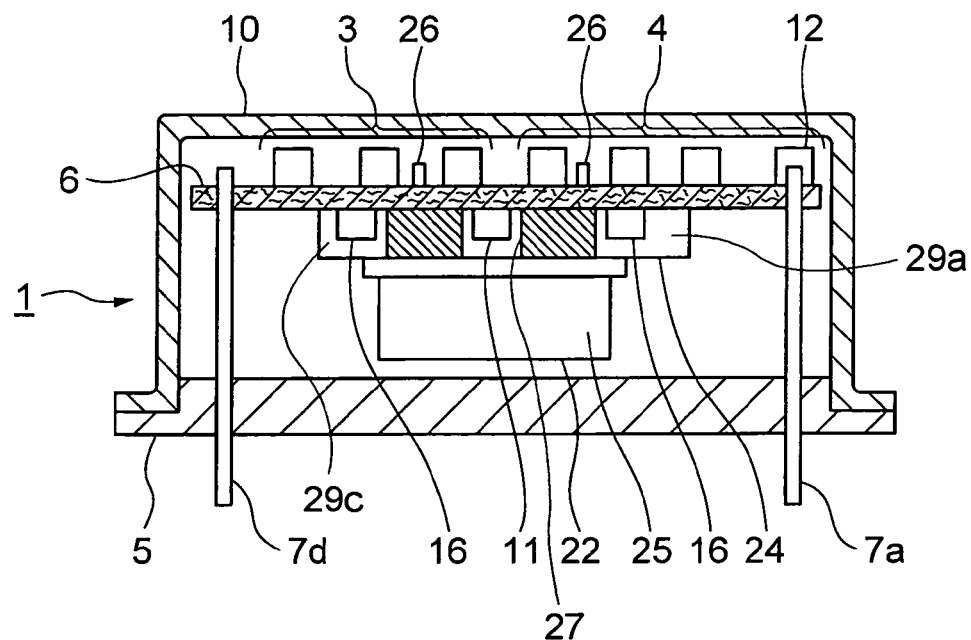
FIG. 7A is a cross-sectional view thereof.
Figure 7B:
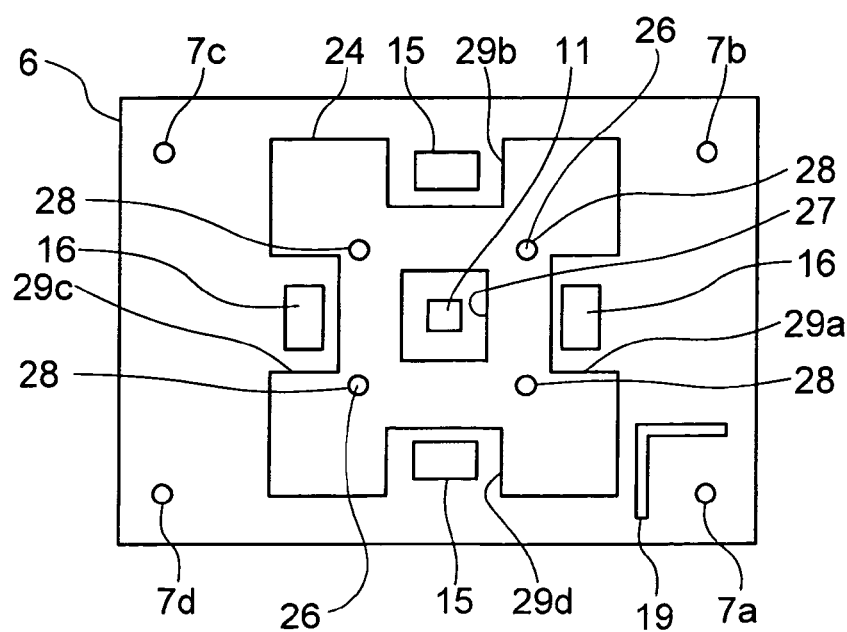
FIG. 7B is a plan view of a circuit substrate accommodated within the temperature controlled oscillator, with a crystal resonator being absent therefrom.

FIG. 7 includes drawings for describing a sixth embodiment of a temperature controlled oscillator of the present invention, wherein FIG. 7A is a cross-sectional view thereof, and FIG. 7B is a plan view showing a top view of a circuit substrate accommodated within the temperature controlled oscillator, with a crystal resonator being absent therefrom. The same reference symbols are given to the portions the same as those in the first embodiment above, and descriptions thereof are therefore simplified or omitted.

The sixth embodiment differs from the first embodiment above in that a lead wire type crystal resonator 22 is used as a crystal resonator, and a heat conducting plate 24 is provided between the lead wire type crystal resonator 22 and the circuit substrate 6.

The lead wire type crystal resonator 22 is such that a crystal element (not shown in the drawing) is seal-enclosed inside a metallic container 25, and lead wires 26 that extend to the outer bottom surface of the metallic container 25 are electrically connected to the crystal element. The lead wire type crystal resonator 22 is joined with the circuit substrate 6, and the lead wires 26 and an oscillating circuit 3 are electrically connected with each other. At this time, between the lead wire type crystal resonator 22 and the circuit substrate 6, there is arranged the heat conducting plate 24 having a predetermined thickness.

Here, the heat conducting plate 24 is, for example, a planarly square aluminum plate, a center through hole 27 is provided in the center section thereof, and lead wire through holes 28, through which the lead wires 26 are passed, are provided around the center through hole 27. Moreover, in four side surfaces of the heat conducting plate 24, there are formed cutaways 29a to 29d that pass through in the thickness direction thereof.

As with the first embodiment above, on the circuit substrate 6, there are arranged a thermistor 11, power transistors 15, and heating resistors 16 (refer to FIG. 1A). When the heat conducting plate 24 is joined with the circuit substrate 6, the thermistor 11 is arranged in the center through hole 27, the power transistors 15 are arranged in the cutaways 29b to 29d, and the heating resistors 16 are arranged in the cutaways 29a to 29c.

According to such a configuration, the lead wire type crystal resonator 22, the heat conducting plate 24, the power transistors 15, and the heating resistors 16 are thermally bonded with each other, and consequently, the crystal resonator 22 is efficiently heated and electric power consumption of the heating resistors 16 can be suppressed.

A temperature controlled oscillator that uses a lead wire type crystal resonator 22 and a heat conducting plate 24 is disclosed in Patent Document 2 (Japanese Unexamined Patent Publication No. 2005-333315). However, the temperature controlled oscillator disclosed in Patent Document 2 does not have an insulation groove 19a formed therein and accordingly has not resolved the problems described in Problems in Prior Art above.

Another Embodiment

In the above respective embodiments, the thermistor 11 is used as the first temperature sensor that detects the operating temperature of the crystal resonators 2 and 22, and the linear resistor 12 is used as the second temperature sensor that detects the surrounding temperature of the temperature controlled oscillator 1. However, arbitrary devices that substantially change the resistance value thereof according to the temperature may be used as the temperature sensors as necessary.

However, the first temperature sensor and the second temperature sensor need to be arranged (connected) within the temperature control circuit 4 so that the heating resistor releases heat according to the operating temperature of the crystal resonators 2 and 22 and the surrounding temperature of the temperature controlled oscillator to thereby make the operating temperature of the crystal resonators 2 and 22 constant.

Figure 8A:
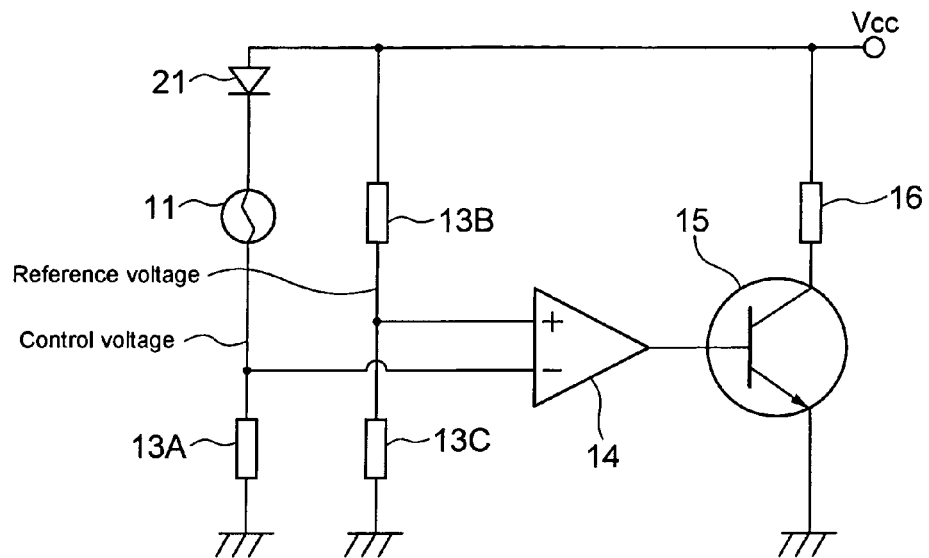
FIG. 8A is a schematic circuit diagram of a temperature control circuit thereof.
Figure 8B:
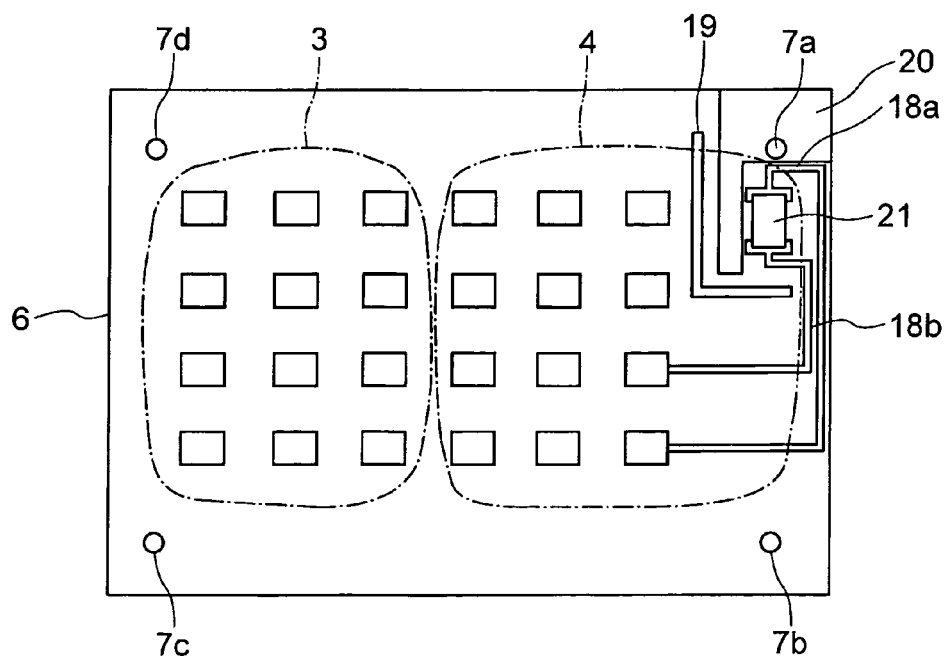
FIG. 8B is a plan view of a circuit substrate accommodated within the temperature controlled oscillator.

As an embodiment of the present invention, for example, a circuit shown in FIG. 8A may also be used as the temperature control circuit 4. In this case, the surrounding temperature of the temperature controlled oscillator 1 is detected with use of a diode 21, the resistance value of which becomes lower as temperature rises, instead of using the linear resistor 12 shown in FIG. 11. In this case, as can be seen clearly in FIG. 8A, the diode 21 is not connected to the ground. Therefore, as shown in FIG. 8B, having electrically isolated the lead wire 7a, which serves as a ground, and the diode 21 from each other, the diode 21 and the heating resistor 16 are thermally isolated from each other, using the insulation groove 19.

Figure 9:
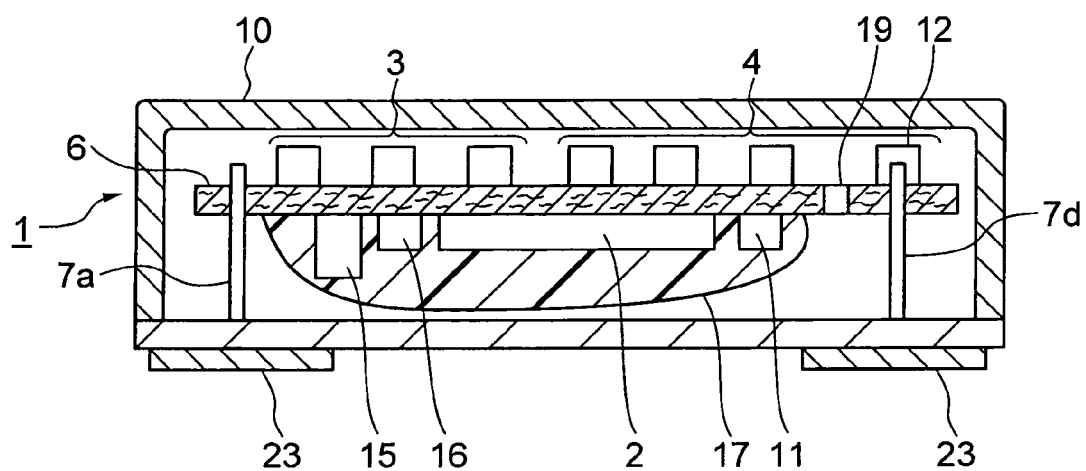
FIG. 9 is a cross-sectional view for describing still another embodiment of a temperature controlled oscillator of the present invention.
Figure 10A:
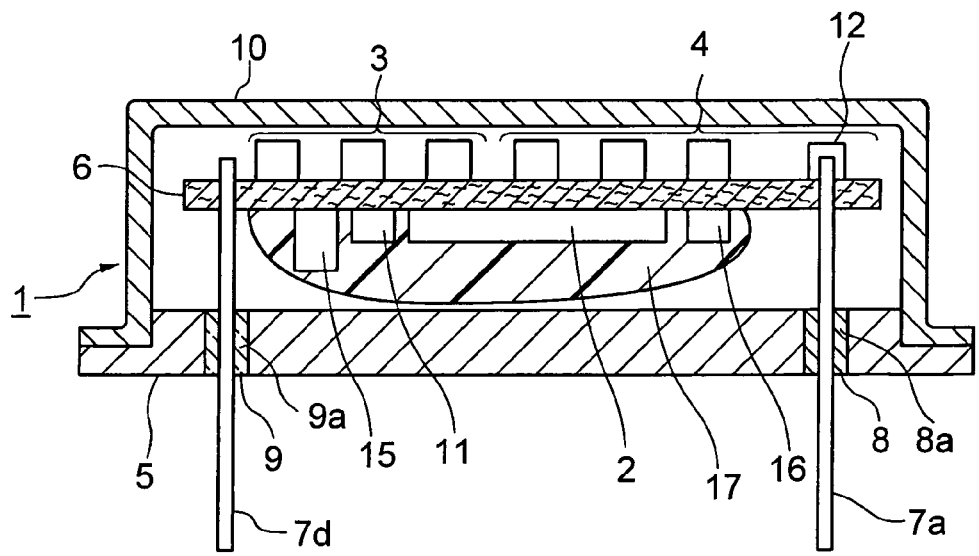
FIG. 10A is a cross-sectional view thereof.
Figure 10B:
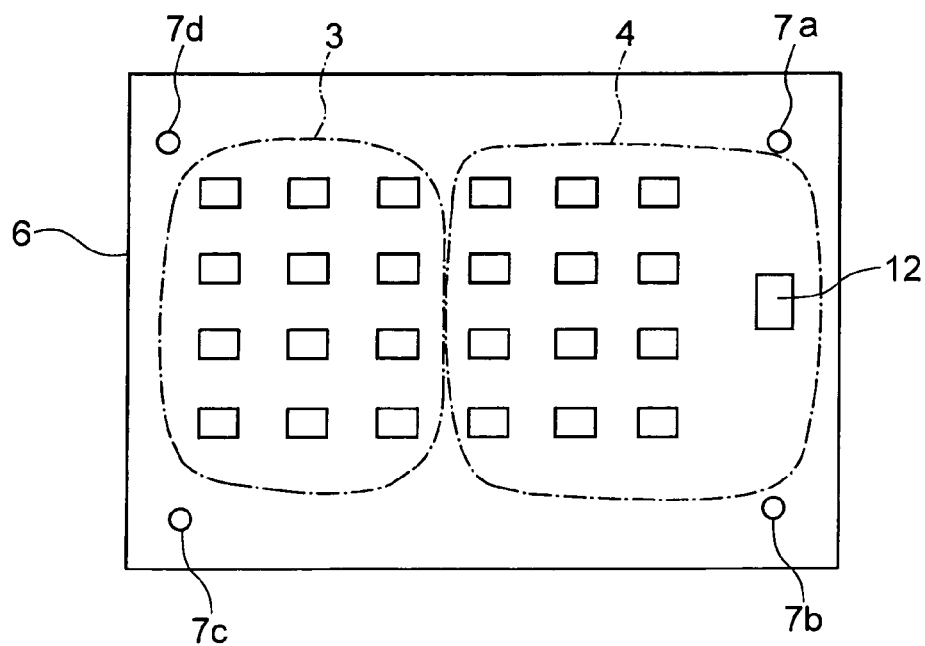
FIG. 10B is a plan view of a circuit substrate accommodated within the temperature controlled oscillator.

Moreover, as shown in FIG. 9 (refer to Patent Document 3: Japanese Unexamined Patent Publication No. 2008-117804), the present invention may be applied to a temperature controlled oscillator that uses a surface mount type mount terminal 23. Furthermore, a crystal resonator having a crystal element of SC-cut, IT-cut and the like accommodated therein may also be used.

What is claimed is:

1. A temperature controlled crystal oscillator provided with a circuit substrate having a crystal resonator, an oscillating circuit, and a temperature control circuit, arranged on one or both principal surfaces, and a container main body that accommodates said circuit substrate and has mount terminals on an outer bottom surface thereof, wherein said temperature control circuit includes at least a first temperature sensor that detects an operating temperature of said crystal resonator, a second temperature sensor that detects a surrounding temperature of said container main body, wherein a metal film surrounds a periphery of said second temperature sensor, and a heating resistor that applies heat to said crystal resonator according to a temperatures detected by said first temperature sensor and said second temperature sensor, and lead wires extend from said circuit substrate and are connected electrically to said mount terminals, wherein an insulation groove that passes through said circuit substrate in a thickness direction is formed between: a first lead wire closest to said second temperature sensor, wherein said first lead wire is electrically connected to said metal film, and said second temperature sensor; and said heating resistor.

2. A temperature controlled crystal oscillator according to claim 1, wherein said first lead wire that extends from said circuit substrate having said second temperature sensor arranged thereon and said insulation groove, functions as a ground.

3. A temperature controlled crystal oscillator according to claim 2, wherein one principal surface of said circuit substrate includes said insulation groove, and on which said second temperature sensor is arranged.

4. A temperature controlled crystal oscillator according to claim 1, wherein said second temperature sensor arranged on said circuit substrate having said insulation groove, is electrically connected to said first lead wire.

5. A temperature controlled crystal oscillator according to claim 1, wherein said second temperature sensor is arranged on one principal surface of said circuit substrate having said insulation groove, and said heating resistor is arranged on another principal surface of said circuit substrate.

6. A temperature controlled crystal oscillator according to claim 1, wherein said circuit substrate is of a planarly rectangular shape; said first lead wire and second to fourth lead wires extend from four corner sections of said circuit substrate; and between said heating resistor and at least one of said second to fourth lead wires, there is formed an insulation groove that passes through said circuit substrate in a thickness direction and corresponds to said second to fourth lead wires.

7. A temperature controlled crystal oscillator according to claim 1, wherein said insulation groove is of a narrow groove shape, and one end thereof is formed so as to open to an outer periphery of said circuit substrate.

8. A temperature controlled crystal oscillator according to claim 1, wherein said first temperature sensor is a thermistor, and said second temperature sensor is a linear resistor.

9. A temperature controlled crystal oscillator comprising:
a circuit substrate having a crystal resonator;
an oscillating circuit;
a container main body that accommodates said circuit substrate and has mount terminals on an outer bottom surface thereof;
a temperature control circuit, arranged on one or both principal surfaces of said circuit substrate, said temperature control circuit comprises:
at least a first temperature sensor that detects an operating temperature of said crystal resonator;
a second temperature sensor that detects a surrounding temperature of said container main body;
a metal film that surrounds a periphery of said second temperature sensor; and
a heating resistor that applies heat to said crystal resonator according to a temperatures detected by said first temperature sensor and said second temperature sensor;
lead wires extend from said circuit substrate and are electrically connected to said mount terminals; and
an insulation groove formed on at least one principal surface of said circuit substrate, on which said second temperature sensor is arranged, said insulation groove passes through said circuit substrate in a thickness direction formed between a first lead wire closest to said second temperature sensor and said second temperature sensor, and said heating resistor, and wherein said first lead wire is electrically connected to said metal film and functions as a ground.

10. A temperature controlled crystal oscillator provided with a circuit substrate having a crystal resonator, an oscillating circuit, and a temperature control circuit, arranged on one or both principal surfaces, and a container main body that accommodates said circuit substrate and has mount terminals on an outer bottom surface thereof, wherein said temperature control circuit includes at least a first temperature sensor that detects an operating temperature of said crystal resonator, a second temperature sensor that detects a surrounding temperature of said container main body, and a heating resistor that applies heat to said crystal resonator according to a temperatures detected by said first temperature sensor and said second temperature sensor, and lead wires extend from said circuit substrate and are connected electrically to said mount terminals,
wherein an insulation groove that passes through said circuit substrate in a thickness direction is formed between: a first lead wire closest to said second temperature sensor, and said second temperature sensor; and said heating resistor, and wherein said insulation groove is of a narrow groove shape, and one end thereof is formed so as to open to an outer periphery of said circuit substrate.

* * * * *